United States Patent [19]

Eichelberger et al.

[11] Patent Number: 5,019,946

[45] Date of Patent: May 28, 1991

[54] HIGH DENSITY INTERCONNECT WITH HIGH VOLUMETRIC EFFICIENCY

[75] Inventors: Charles W. Eichelberger, Schenectady; Robert J. Wojnarowski, Ballston Lake, both of N.Y.

[73] Assignee: General Electric Company, Schenectady, N.Y.

[21] Appl. No.: 250,010

[22] Filed: Sep. 27, 1988

[51] Int. Cl.$^5$ .............................................. H05K 1/11
[52] U.S. Cl. .................................... 361/414; 361/396
[58] Field of Search ............... 361/385, 393, 396, 405, 361/406, 412, 414

[56] References Cited

U.S. PATENT DOCUMENTS

| | | | |
|---|---|---|---|
| 3,029,495 | 4/1962 | Doctor | 361/396 X |
| 4,283,755 | 8/1981 | Tracy | 361/393 |
| 4,574,331 | 3/1986 | Smolley | 361/393 |
| 4,689,103 | 8/1987 | Elarde | 361/414 X |
| 4,733,461 | 3/1988 | Nakano | 29/830 |
| 4,783,695 | 11/1988 | Eichelberger et al. | 357/65 |
| 4,811,166 | 3/1989 | Alvarez et al. | 361/386 |
| 4,868,712 | 9/1989 | Woodman | 361/396 X |
| 4,882,454 | 11/1989 | Peterson et al. | 361/386 X |

OTHER PUBLICATIONS

C. W. Eichelberger et al., "High-Density Interconnects for Electronic Packaging", SPIE, vol. 877, *Micro-Optoelectronic Materials* (1988), pp. 90-91.

*Primary Examiner*—Leo P. Picard
*Assistant Examiner*—Paramita Ghosh
*Attorney, Agent, or Firm*—Marvin Snyder; James C. Davis, Jr.

[57] ABSTRACT

Interconnected integrated circuits (16) packaged at a very high density are fabricated beginning with a plurality of substrates (50 or 400 or 500) where each substrate has metal edge contact sites (12 or 507). Several substrates are joined together in a stack (82 or 402 or 512) held together tightly by bolts (62) or by a thermoplastic adhesive (510). An interconnect pattern (250 or 423) electrically connects integrated circuits (16) on different substrates. Defective substrates are removable from the stack for repair by removing the bolts or by heating the adhesive to soften it sufficiently to allow removal of the individual substrate. The interconnect pattern, which is removed whenever a substrate is replaced, is reapplied after the removed substrate has been replaced.

22 Claims, 10 Drawing Sheets

HIGH DENSITY INTERCONNECT WITH HIGH VOLUMETRIC EFFICIENCY

CROSS-REFERENCE TO RELATED APPLICATIONS

This application is related to the following co-pending applications which are assigned to a common assignee and are incorporated herein by reference:

"An Adaptive Lithography System to Provide High Density Interconnect", Ser. No. 947,461, filed Dec. 29, 1986;

"Integrated Circuit Packaging Configuration for Rapid Customized Design and Unique Test Capability", Ser. No. 912,457, filed Sept. 26, 1986;

"Multichip Integrated Circuit Packaging Configuration and Method", Ser. No. 912,456, filed Sept. 26, 1986; now U.S. Pat. No. 4,783,695 issued Nov. 8, 1988;

"Method and Apparatus for Packaging Integrated Circuit Chips Employing a Polymer Film Overlay Layer", Ser. No. 912,458, filed Sept. 26, 1986;

"Method and Configuration for Testing Electronic Circuits and Integrated Circuit Chips Using a Removable Overlay Layer", Ser. No. 230,654, filed Aug. 5, 1988, continuation of application Ser. No. 912,454, filed Sept. 26, 1986, now abandoned "Method and Apparatus for Removing Components Bonded to a Substrate", Ser. No. 249,927, filed Sept. 27, 1988.

BACKGROUND OF THE INVENTION

1. Field of the Invention

This invention is generally related to a method for interconnecting integrated circuits with high volumetric efficiency and, more particularly, to a method of selectively interconnecting the edge contact areas of a plurality of tightly stacked substrates having integrated circuit patterns thereon with edge metallization contact areas.

2. Description of the Prior Art

Interconnecting high performance circuits, such as very large scale integrated circuit (VLSI) chips, presents the circuit designer with several problems. VLSI chips often have one hundred or more pins where the pins have a pitch of less than ten mils. That is to say, the sum of the line width plus the distance between two lines is less than ten thousandths of an inch. The VLSI chips typically must be joined to a circuit board which has a pitch of twenty five to fifty mils. In order to connect the VLSI chip to the circuit board, a "fan out" region of interconnecting lines must be provided. The fan out region occupies valuable space on the circuit board and the long lead lengths contribute high inductance. Thus, the fan out design limits the high speed capability of the circuit. In multichip substrates, which are comprised of numerous chips mounted on the same substrate, interconnections among chips on the substrate allow high speed performance, but substantial performance loss occurs in going from the substrate to the printed circuit board. Not only is soldering several hundred pins on twenty five mil centers a very difficult task, but in addition, thermal mismatch complications and hermeticity problems affect the size of substrate which can be created. According to Rent's rule, the number of pins required increases in accordance with the square root of the number of gates enclosed by the circuitry. Since each pin must be hermetically sealed, the advantage of multichip substrates is severely limited by the unavailability of hermetic packages which can seal more than about three hundred pins.

SUMMARY OF THE INVENTION

One object of this invention is to provide a method of selectively interconnecting high density interconnected (HDI) substrates.

Another object of the invention is to provide an interconnect method which can allow a number of substrates to effectively share the same hermetic enclosure.

Still another object of this invention is to provide a selective interconnect method which has very high volumetric efficiency.

According to the invention, a plurality of HDI substrates are fabricated using high production methods. The HDI substrates include surface metal lines on the surface of a substrate, integrated circuit chips mounted on the substrate, a polymer overlay layer positioned above the chips, a selective interconnect pattern formed on the polymer overlay layer, and metal edge contact pads formed at the edges of the substrate. The selective interconnect pattern electrically connects the chip contact pads with the surface metal lines and the surface metal lines are electrically connected to the metal edge contact pads. The selective interconnect pattern is formed on the polymer overlay layer using an adaptive laser lithography system and is described in the above-identified cross-referenced applications. The metal edge contact pads act as sites for selective interconnection with other substrates in a stacked array fabricated in accordance with this invention. The metal edge contact pads act as sites for selective interconnection with other substrates in a stacked array fabricated in accordance with this invention. The metal edge contact pads may be fabricated such that they wrap around the substrate edge; however, the cross section of the metal edge contact pad may be large enough to act as a selective interconnection site, thereby eliminating the need for wraparound metal.

A protective layer is applied on top of each HDI substrate to protect the overlying, metallized, selective interconnect pattern. The HDI substrates have the unique feature that they are substantially planar and are easily stacked upon one another. Each HDI substrate is tested for proper functioning before it is placed in a stacked array. A tightly stacked array of substrates allows heat to flow freely through the stack such that a common heat sink can be utilized. The substrates can be held together by a thermoplastic adhesive material or, alternatively, they can be held together by fasteners such as, for example, nut and bolt combinations which extend through aligned apertures in each substrate in the stack.

Stacked HDI substrates are selectively interconnected using the metal edge contact pads. In one configuration, insulator film is applied to the sides of the stacked array. Via holes are created through the insulator film to the metal edge connection pads using a laser dithering technique. An interconnect pattern is then formed on top of the insulator film using adaptive laser lithography. Electroplating then builds up the interconnect pattern. Additional interconnect layers may be formed on top of the interconnect pattern if a multilevel interconnection scheme is required. The result is a module of stacked HDI substrates where the substrates are interconnected by metallization lines applied on an insulative layer covering the sides of the stacked array. The metallization lines pass through the vias in the insulator layer to the metal contact pads at the edges of each of the HDI substrates in the stack.

A stack of integrated circuit chips, where the chips are not mounted on a substrate, can be interconnected in the same fashion. Each chip must have an edge contact pad that is even with the edge of the chip and has sufficient cross section to allow for interconnection. The chips are held together in a tightly stacked array by a thermoplastic adhesive. An insulative layer is formed on the sides of the stacked chips. Vias are laser drilled through the insulative layer to the edge contact pad. The adaptive lithography system is then used to create a selective interconnect pattern on the sides of the stacked array of chips.

In a second configuration, the HDI substrates in the stacked array are of decreasing size such that a pyramidal stack is formed. In a pyramidal stack, the metal edge connection pads are exposed from above and are not required to extend around to the edge of the substrate. Conventional wire bonding techniques are used for selective interconnection of substrates in the stack wherein the wires extend upward from the exposed metal edge connection pads in the pyramidal module. The pyramidal module can be placed in a metal can with wire conductors extending through the side of the can (but insulated therefrom) used for connection to the contact pads in the pyramidal stack.

Repair of a module of interconnected HDI substrates in a stacked array is accomplished without risk of damage to the good (i.e., completely functional) substrates in the stack. The interconnection pattern created on the sides of the stacked array is simply removed. Bad (i.e., defective) substrates are taken from the stack and replaced by good substrates. A new interconnection pattern is then formed on the sides of the repaired stacked array. In addition to repairing the stacked array, the ability to remove the interconnection pattern allows for substitution of totally new and redesigned interconnection patterns.

In another configuration, a two-dimensional array comprised of HDI substrates and/or modules of interconnected stacked arrays are interconnected by an interconnect pattern formed on a polymer overlay layer. The HDI substrates or stacked modules may be placed on a common heat sink and are sealed under the overlay layer. Vias to contact pads on the top of the modules are created through the overlay layer. An interconnection pattern is then formed on the overlay layer to selectively interconnect the modules. Repair is easily accomplished by removing the overlay layer, replacing the defective substrate or module, laminating on a new overlay layer, and creating a new interconnect pattern. Since the overlay is flexible, there is no stress built up over the modules.

In another embodiment, a two-dimensional module array includes an interconnection pattern formed on an overlay layer; however, no substrate is required for holding the array. The advantage of this array is that the volume required by the circuit is not much greater than the volume of the silicon making up the circuit. The entire circuit and overlay can be immersed in a liquid coolant.

BRIEF DESCRIPTION OF THE DRAWINGS

The foregoing and other objects, aspects and advantages of the invention will be better understood from the following detailed description of the invention with reference to the drawing, in which.

DETAILED DESCRIPTION OF THE PREFERRED EMBODIMENTS OF THE INVENTION

Figure 1:
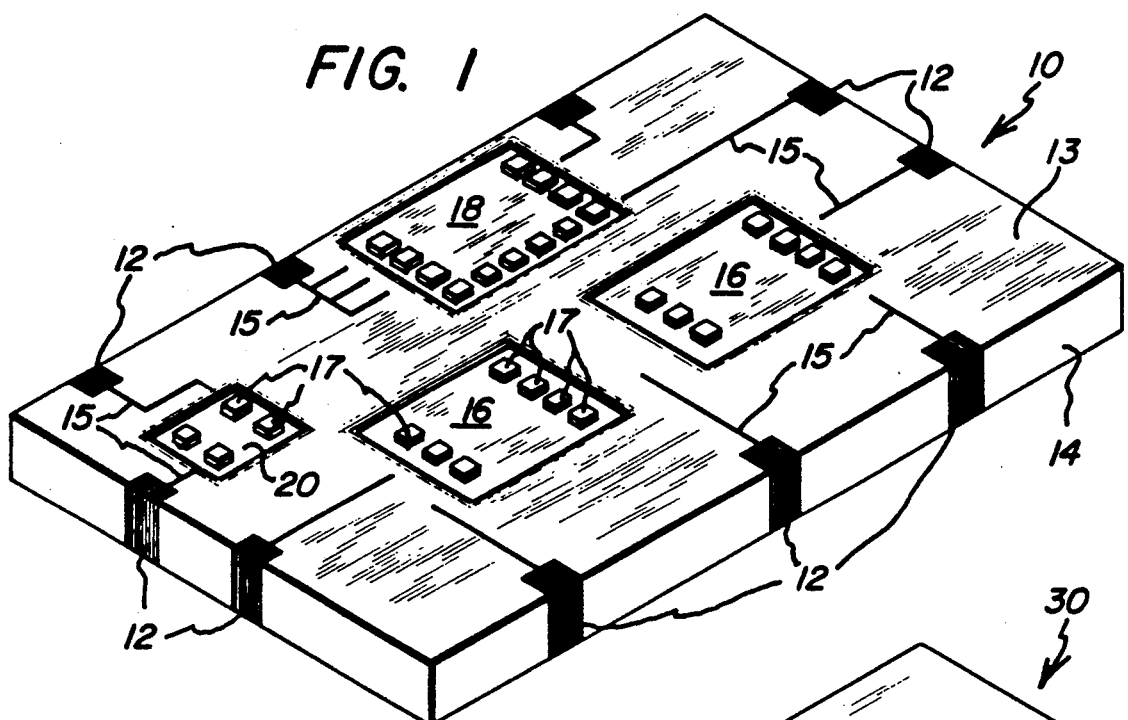
FIG. 1 is a perspective view of a substrate having wraparound metal edge connections.

FIG. 1 illustrates an insulative substrate 10 having a plurality of metal edge connection pads 12 where the metallization is wrapped from the top 13 around to the edge 14 of the substrate 10. Edge connection pad 12 metallization on the top 13 of substrate 10 is electrically connected to surface interconnect 15. The surface interconnect 15 comprises metal distribution lines that extend to points close to integrated circuits 16 and other electronic component chips 18 and 20 mounted in the substrate 10. The chips 16, 18 and 20 are mounted in wells formed in the substrate 10 such that the top of the chip 16, 18 or 20 is essentially even with the substrate 10 surface 13. Edge connection pad 12 metallization on the edge 14 of the substrate 10 acts as sites for subsequent interconnection of stacked substrates 10.

Figure 2:
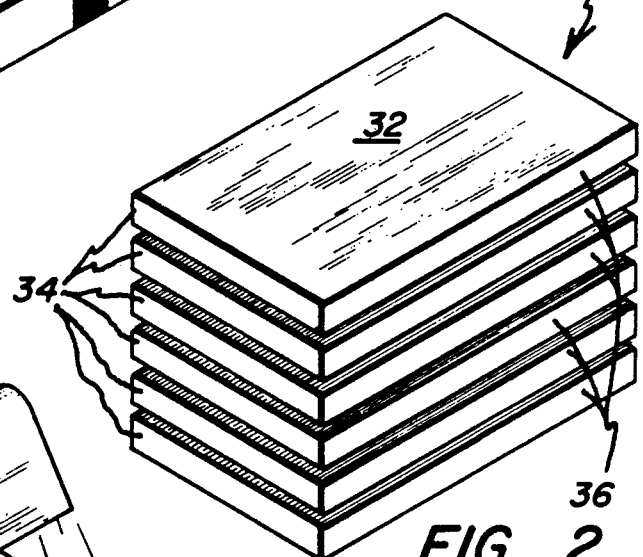
FIG. 2 is a perspective view of a stack of frames ready for metallization.
Figure 3:
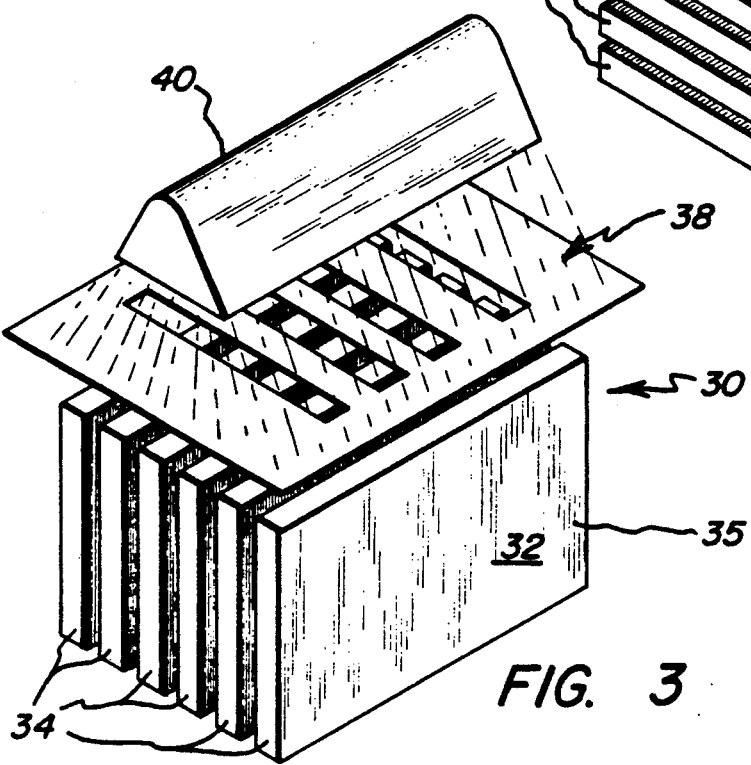
FIG. 3 is a perspective view of a stack of frames which are being patterned using an optical masking technique.

The metal edge connection pads 12 can be fabricated by a variety of different techniques using a variety of different metals. FIGS. 2 and 3 illustrate a preferred high production method of fabricating the metal edge connection pads 12. In FIG. 2, a stack 30 of frames 32, each having their top surface coated with metal, is assembled with the edges 34 comprising the sides of the stack 30. The frames 32 are comprised of silicon, alumina, or any other material having a thermal coefficient of expansion matched with that of the chips 16, 18 and 20. Small gaps 36 space the frames 32 from one another. The sides of the stack 30 are then sputter coated with metal using conventional techniques. If aluminum metallization is used, the following thicknesses have been found to be sufficient: 1000 Angstroms (Å) titanium, followed by 1-3 microns of aluminum. If copper metallization is used, the following thicknesses have been found to be sufficient: 1000 (Å) chrome, followed by 3000 (Å) sputtered copper, followed by electroplating in an acid copper sulfate plating bath at a current density of 35 Amps/square foot. The aluminum metallization is preferred because it is more easily repaired. Copper interconnect metallization can be removed from aluminum by acid with no damage to the aluminum. While four runs are required to coat all four sides of the stack 30, an extremely large number of frames 32 can be coated at a time using this method. The gaps 36 allow sputtered metal to wrap around the edge 34 of each frame 36. As shown in FIG. 3, the metallization which has been sputtered on the sides of stack 30 is patterned using a conventional optical exposure technique. The stack 30 is first sprayed with photoresist and is soft baked. A suggested coating may be Fanton F360 Resist, produced by Armstrong World Industries of Lancaster, Pa., with a bake of five minutes at 80° C. A conventional mask 38 and ultraviolet (UV) exposure lamp 40 is used to expose the photoresist coating. Mask 38 controls the final positions of edge connection pads 12 and can be formed to accommodate any desired location for the edge connection pads.

When all four sides of stack 30 have been exposed, the stack is disassembled into individual frames 32. Photoresist is sprayed onto the top surface 35 of each frame 32 and is soft baked. A patterned surface interconnect 15 is formed from the metal on the surface of each silicon frame 32 by either conventional optical exposure techniques or, preferably, by the adaptive lithography technique disclosed in the above-referenced co-pending patent application, Ser. No. 947,461. The surface interconnect 15, as best shown in FIG. 1, is only an example of a possible pattern which can be formed on substrate 10. Ideally, surface interconnect 15 closely approaches the chip wells formed in the substrate. Developing is accomplished using standard batch process immersion techniques. The edges 34 and tops 35 of the silicon frames 32 are developed simultaneously. A developer of 1% sodium carbonate is used for the resist. The aluminum can be etched by a ferric chloride etchant mixed as two parts water to one part ferric chloride. This etchant is compatible with Fanton F360 resist. The resist is then stripped using acetone since caustic strippers are known to attack aluminum. The result of the procedures outlined above is a substrate 10, as best shown in FIG. 1, including metal edge connection pads 12 and surface interconnect 15; however, the integrated circuit chips 16 and other electronic components 18 and 20 have not yet been added.

Each individual substrate 10, formerly frame 32 in stack 30 of FIG. 2, is then fabricated according to procedures described in the above-referenced co-pending patent applications. In this procedure, a die attach material such as Ultem® 6000 resin, sold by the General Electric Company, Pittsfield, Mass., is stamped in the bottom of chip wells such as those formed in substrate 10 of FIG. 1. The chip wells correspond to the integrated circuits such as integrated circuits 16 of FIG. 16 and other electronic component chips such as chips 18 and 20 of FIG. 1. The number of chips to be placed on a single substrate is limited only by the size of the substrate. The chips are placed in the chip wells and the substrate is then heated in stages to 300° C. to set the die attach material. A layer of Ultem 1000 resin in solvent is sprayed over the top of the substrate. The substrate is again baked in progressive increments to 300° C. An overlay of Kapton polyimide film, available from E. I. du Pont de Nemours and Company of Wilmington, Del., is processed by spraying on a mix of Ultem resin in n-Methyl Pyrolidone (NMP) solvent, letting the Kapton film soak in the mixture, and curing at 400° C. A processed Kapton layer is laminated over the top 13 of substrate 10 at a temperature of 260° C. Via holes are formed through the Kapton overlay layer to chip contact pads, such as pads 17 located on top of chips 16, 18 and 20 shown in FIG. 1, and via holes are formed to the surface interconnect lines, such as interconnect 15 lines which are next to the chip contact pads 17 in FIG. 1. Metal (not shown) is coated over the entire Kapton overlay layer using sputtering and electroplating techniques. The metal is then patterned by resist exposure using the adaptive lithography system followed by etching.

Figure 4:
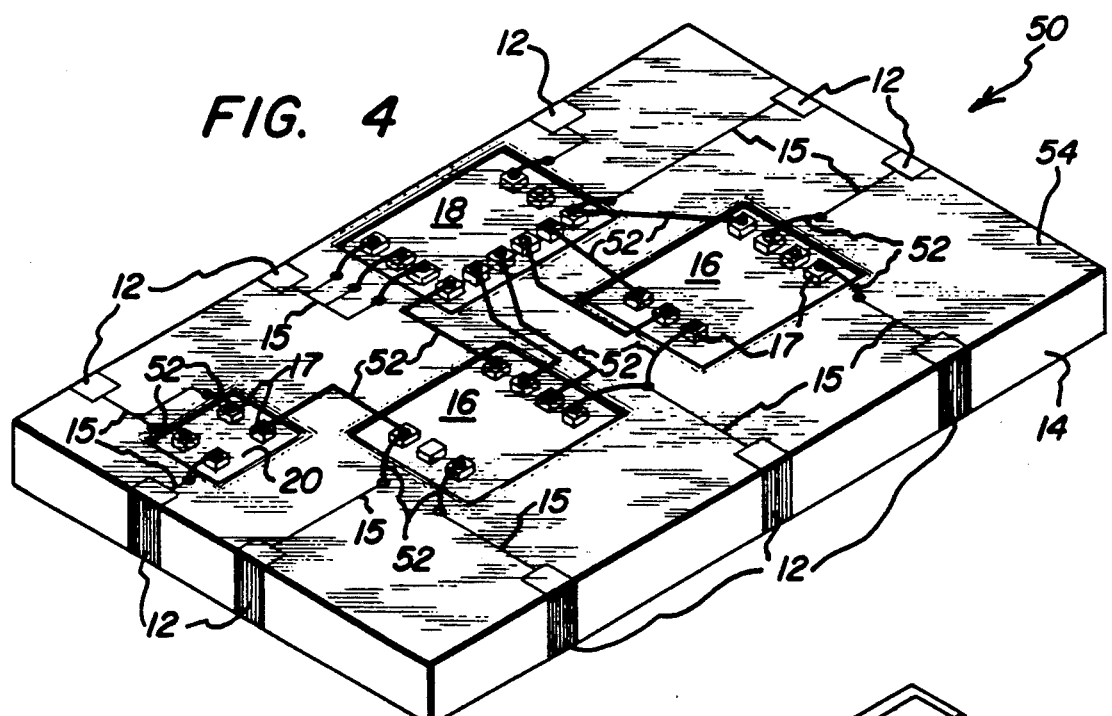
FIG. 4 is a perspective view of an HDI substrate having a polymer overlay layer with selective interconnections to chips mounted on a substrate below.

FIG. 4 illustrates an HDI substrate 50 fabricated according to the procedures outlined above where an interconnect pattern 52 has been selectively formed on top of a polymer overlay layer 54 (Kapton film). Chips 16, 18 and 20, as well as surface interconnect 15, are shown as dashed lines to indicate their positions under polymer overlay layer 54. The electrical components of the HDI substrate are interconnected as follows: chips 16, 18 and 20 are electrically connected to the interconnect pattern 52 by metal-filled vias above the chip contact pads 17, interconnect pattern 52 is electrically connected to the surface interconnect 15 by metal-filled vias, and surface interconnect 15 is electrically connected to the metal edge connection pads 12. The metal edge connection pads 12 are exposed on the edge 14 of HDI substrate 50 and allow for interconnecting a plurality of HDI substrates 50 by the inventive methods described below. In some embodiments of the invention, the metal edge connection pads 12 do not wrap around edge 14 of the substrate 10 and in these embodiments the cross section (not shown) of the metal is exposed to allow for interconnecting a plurality of substrates. Interconnect pattern 52 is overcoated with a protective layer of SPI 129 silicone polyimide available from General Electric Microelectronic Materials of Phoenix, Ariz. The protective layer is preferably applied by spin coating on one coat of SPI 129 at 1500 revolutions per minute (rpm) where the coat is dried for five minutes at 100° C. and five minutes at 200° C. The protected substrates 50 can then be stacked together with no damage to the interconnect pattern 52. A distinguishing feature of the HDI substrates 50 is that each substrate is essentially flat on the top as well as the bottom and can therefore be stacked so tightly that heat can be conducted through the stack without damaging components 16, 18 and 20 on an HDI substrate 50. Other known interconnect approaches are not able to accomplish this tight stackability. Before the HDI substrates 50 are stacked, they are tested for proper functioning according to the procedures given in the above-referenced co-pending patent applications, such as Ser. No. 912,457. If desired, the HDI substrates 50 can be biased and operated at full power (i.e., burned-in) to weed out weak parts. Test and burn-in are no different than would occur for HDI substrates 50 not intended to be stacked.

Figure 5:
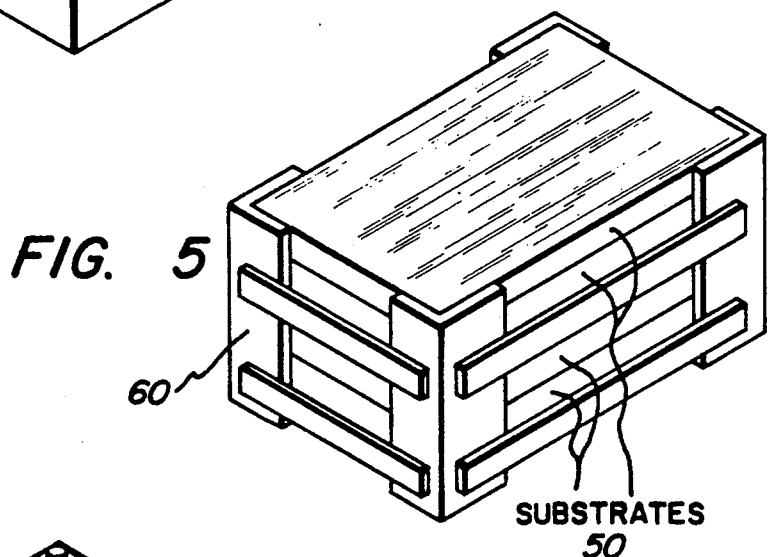
FIG. 5 is a perspective view of a stacked array of HDI substrates being adhesively joined in an alignment jig.
Figure 6:
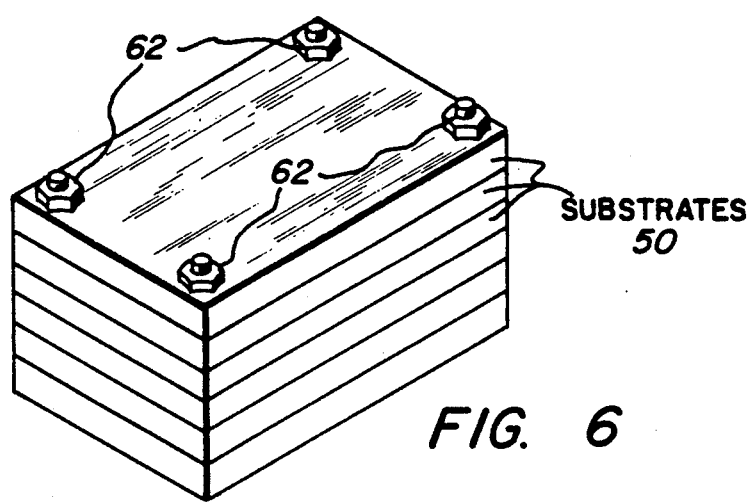
FIG. 6 is a perspective view of a stacked array of HDI substrates being joined by nut and bolt combinations.

FIGS. 5 and 6 illustrate alternative configurations for a first embodiment of the invention where each HDI substrate 50 in a stack has the same dimensions. HDI substrates 50 shown in FIG. 5 are coated with an adhesive which may be loaded with a thermally conductive powder, such as alumina, beryllia, or silver, to promote thermal conductivity. The adhesive base is preferably a thermoplastic material having a melting point below that of the adhesive and dielectric used to fabricate the individual substrates 50. A preferred base material is Silicone Polyimide 2065 available from M & T Chemicals of Rahway, N.J. Note that if a thermoset adhesive were used, the stack could not be easily disassembled for repair. The HDI substrates 50 are stacked in an alignment jig 60 and laminated together using a pressure of twenty pounds per square inch (psi). HDI substrates 50 shown in FIG. 6 are coated with thermal grease and held together by nut and bolt combinations 62 which extend through apertures in the corners of each of the substrates. The apertures can be drilled before or after HDI substrate 50 fabrication.

Figure 7:
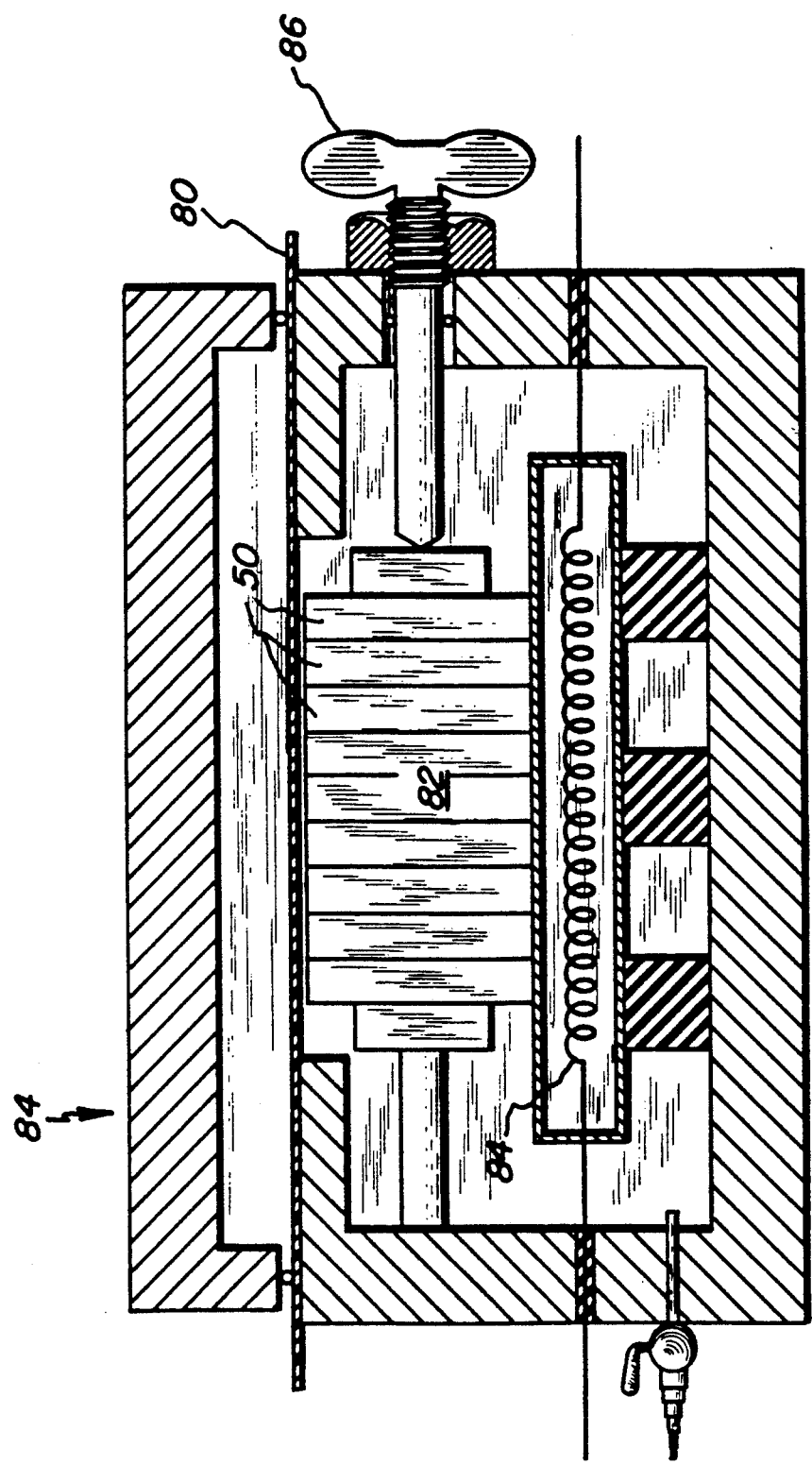
FIG. 7 is a cross-sectional side view of a pressure vacuum laminator showing an insulative film being laminated on one side of a stacked array of HDI substrates.

FIG. 7 illustrates application of an insulative film 80 to the sides of a substrate stack 82. Film 80 will bridge between individual HDI substrates 50 and carry interconnect wiring that selectively interconnects the substrates 50 by connection to the metal edge contact pads 12 (shown in FIG. 4). An insulator may be applied by spray techniques when the substrates are in intimate contact. In the preferred method where a thermoset interconnect carrier film is used, an adhesive is first sprayed on the substrate edges. The adhesive is preferably a heat-softenable or thermoplastic material, such as Silicone Polyimide 2065 available from M&T Chemicals, which has a melting point below that of the adhesive and dielectric used to fabricate the individual substrates. Thermoset adhesives are not recommended because they make it more difficult to separate stack 82 for repair. A thermoset interconnect carrier film 80, such as Kapton film prepared as described above, is coated with the same thermoplastic adhesive as sprayed onto stack S2, allowed to soak for a period of time, and then baked at a very high temperature, such as 400° C. Insulative film 80 (comprised of prepared Kapton with heat-softenable or thermoplastic adhesive) is then laminated to a side of the stack 82 using a pressure vacuum laminator 84. Pressure vacuum laminators of this type have been previously described in the above-identified co-pending application, Ser. No. 912,458. A thumb screw clamp 86 holds together an adhesively joined stack, such as shown in FIG. 5, during lamination. Heat for the lamination process is produced by a heater 81 contained in laminator 84. Several stacks 82 can be laminated simultaneously in one laminator 84. Each of the remaining three sides is similarly laminated to yield a stack of substrates with an insulative film 80 covering all four sides.

Figure 8:
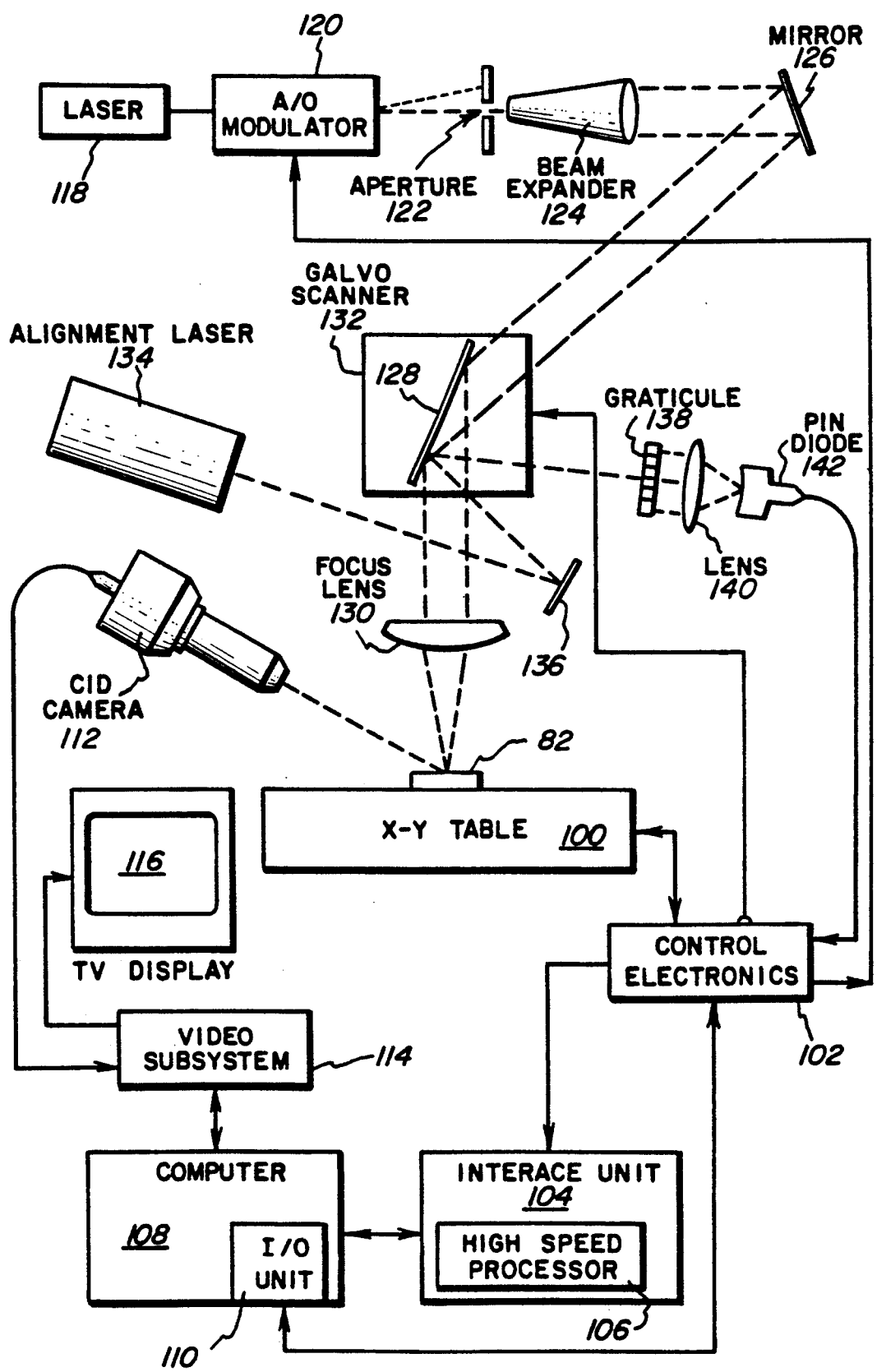
FIG. 8 is a block diagram showing the essential components of an adaptive lithography system used to etch via holes and expose photoresist.

Via holes are next formed through insulative film 80 to the underlying contact pads 12 (shown in FIG. 4) on each of the HDI substrates 50 using the adaptive lithography system described in the above-referenced co-pending patent applications, such as Ser. No. 947,461. FIG. 8 shows the stack 82 of laminated substrates situated on an X-Y table 100 that moves in accordance with signals from control electronics 102. An interface unit 104 having a high speed processor 106 and a computer 108 with an input/output (I/O) unit 110 to provide instructions for control electronics 102. The computer receives positional information from a video camera 112, preferably containing a charge injection device (CID) imager and operating in conjunction with a video subsystem 114 and television display 116. This information corresponds to the position on substrate stack 82 where a laser beam is focussed. The laser beam is generated by a laser 118 and passes through a modulator 120 (typically of the acuosto-optic type), an aperture 122, and a beam expander 124. The laser beam reflects off of two mirrors 126 and 128 and is focussed by lens 130 on substrate stack 82. The position of the laser beam is precisely controlled by controlling the angle of mirror 128 which is in a galvanometer scanner 132. An alignment laser 134 produces a beam which reflects off of mirror 136 and then off of mirror 128. The beam from the alignment laser passes through a graticule 138 and is focussed by a lens 140 onto a PIN diode which signals the control electronics 102. By using information obtained from camera 112 and PIN diode 142, the control electronics 102 can manipulate X-Y table 100 and mirror 128 such that via holes are drilled by laser 118 through insulative film 80 down to pads 12, shown in FIG. 4, on each HDI substrate in stack 82. Any misalignment of the substrates is compensated for by spotting the position of the actual contact areas of the two outermost pads on each substrate. Stack 82 is turned and the process is repeated until via holes on all four sides have been formed.

Figure 9A:
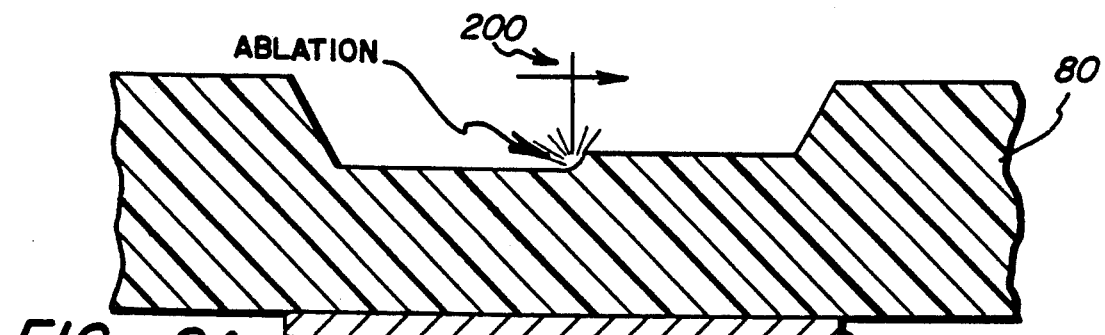
FIGS. 9a through 9c are progressive cross-sectional side views o a laser dithering technique for creating holes in the insulation film on the side of a stacked array to expose the pads on the side of each substrate.
Figure 9B:
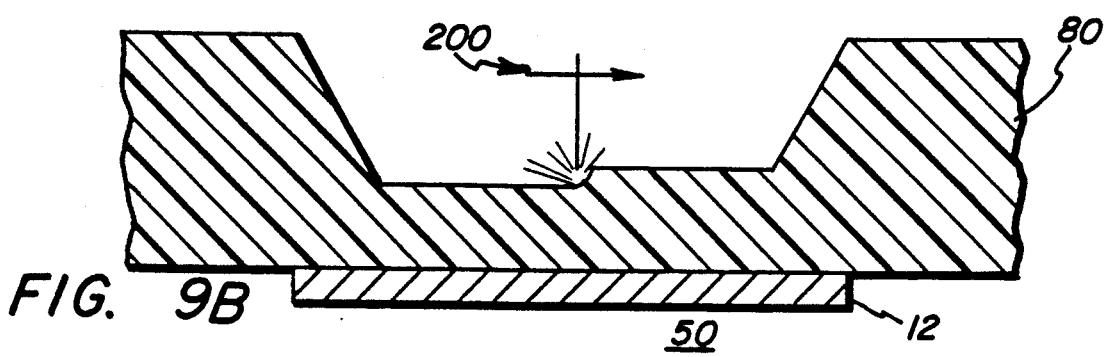
Figure 9C:
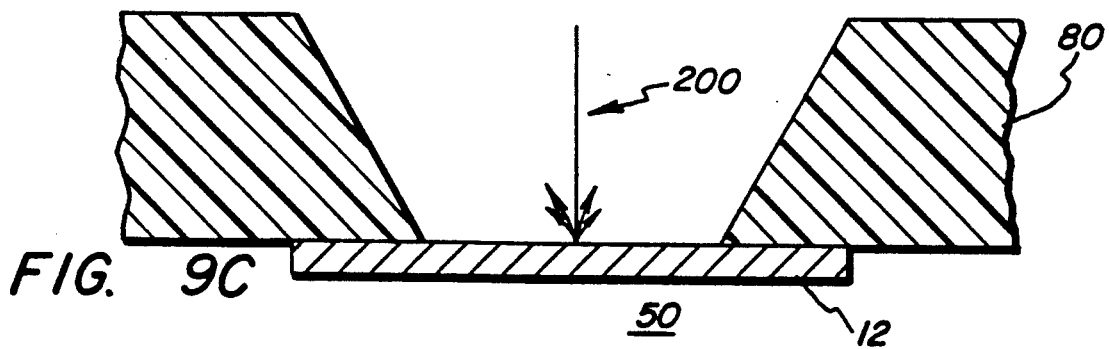

Laser drilling can be accomplished as described in Eichelberger et al. U.S. Pat. No. 4,714,516 issued Dec. 22, 1987 and assigned to the instant assignee, or as described in the above-referenced co-pending patent applications. Alternatively, and preferably, the via holes are laser "dithered" in the manner shown in the progressive cross-sectional side views shown in FIGS. 9a through 9c. A continuous wave (CW) laser beam 200 is focused to a very high energy density over insulative film 80. The spot size $1/e^2$, where e is the base of the system of natural logarithms, is six microns and the laser power is 300 milliwatts (mW) which translates to a maximum watt density of $3.3 \times 10^6$ or 3.3E6 watts/cm$^2$. Laser beam 200 is scanned back and forth across the insulative film 80, as shown in FIGS. 9a and 9b, at a rate of three microns/microsecond. When the metal connection pad 12 on the side of an HDI substrate 50 is reached by laser beam 200, as shown in FIG. 9c, the laser beam is reflected. Since well over half of the laser beam energy is thus reflected, metallization 12 is not heated to its vaporization temperature. The drilling action is stopped when metal pad 12 is exposed. The scan is only on the insulative film one percent of the time, such that power directed toward the via is 0.3 watts times 1 percent, or 3 mW. This amount of power is well below the threshold at which damage to adjacent areas occurs.

After all the via holes have been etched through the insulative film 80 covering the sides of substrate stack 82, the stack is plasma etched in twenty percent $CF_4$ and $O_2$ for a period of four minutes to remove any soot formed by the laser dithering process. Metal is then sputtered onto the sides of stack 82, covering the insulative film and filling the vias which extend to the edge contact pads. Sputtering can be accomplished on a small lot basis using a mechanical "spit" arrangement; however, for high production, many substrate stacks can be coated by four runs in the same machine used for making the edge connections, as described with reference to FIG. 2. Sputtering preferably produces a 1000 (Å) layer of titanium followed by a 2000 (Å) layer of copper. The copper is then built up by electroplating in a copper sulfate bath at 35 amps/square foot (A/sq ft) for five minutes. Finally, stack 82 is electroplated with chrome at 100 A/sq ft for one minute. Fanton F360 resist is then sprayed on each side of stack 82. The resist is soft baked at 80° C. for five minutes for each side. The resist is then exposed using the aforementioned adaptive lithography system, which defines an interconnect pattern on the sides of stack 82.

Figure 10:
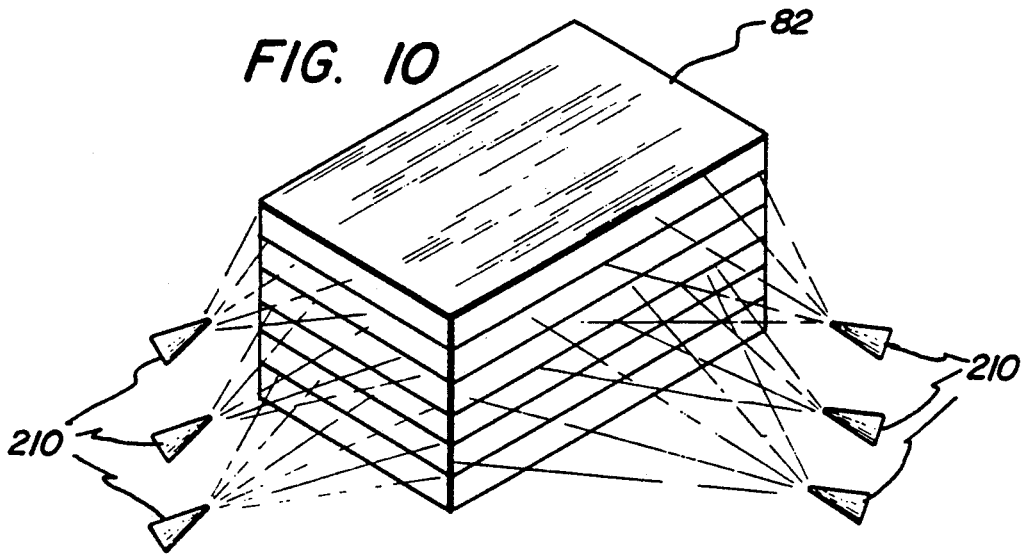
FIG. 10 is a perspective view of a two-sided spray arrangement where spray nozzles are positioned at opposite sides of a substrate stack for spraying developer on the stack.

FIG. 10 shows the process for developing the exposed resist using a two-sided spray technique, where stack 82 is subjected to developer which is sprayed from nozzles 210 positioned on either side of the stack. By thus developing the resist, metal portions are selectively exposed for later etching. After development and rinse, the outermost layer of chrome is etched in dilute hydrochloric acid (HCl). Stack 82 is then rinsed, the copper is etched in a two-sided spray of ferric chloride ($FeCl_2$), and stack 82 is rinsed again. Then the next layer, comprised of titanium, is etched using TFT etch available from Transene Corporation of Rowley, Mass. The resist covering the unexposed lines is thereafter stripped using a dilute solution of ammonium hydroxide.

Figure 11:
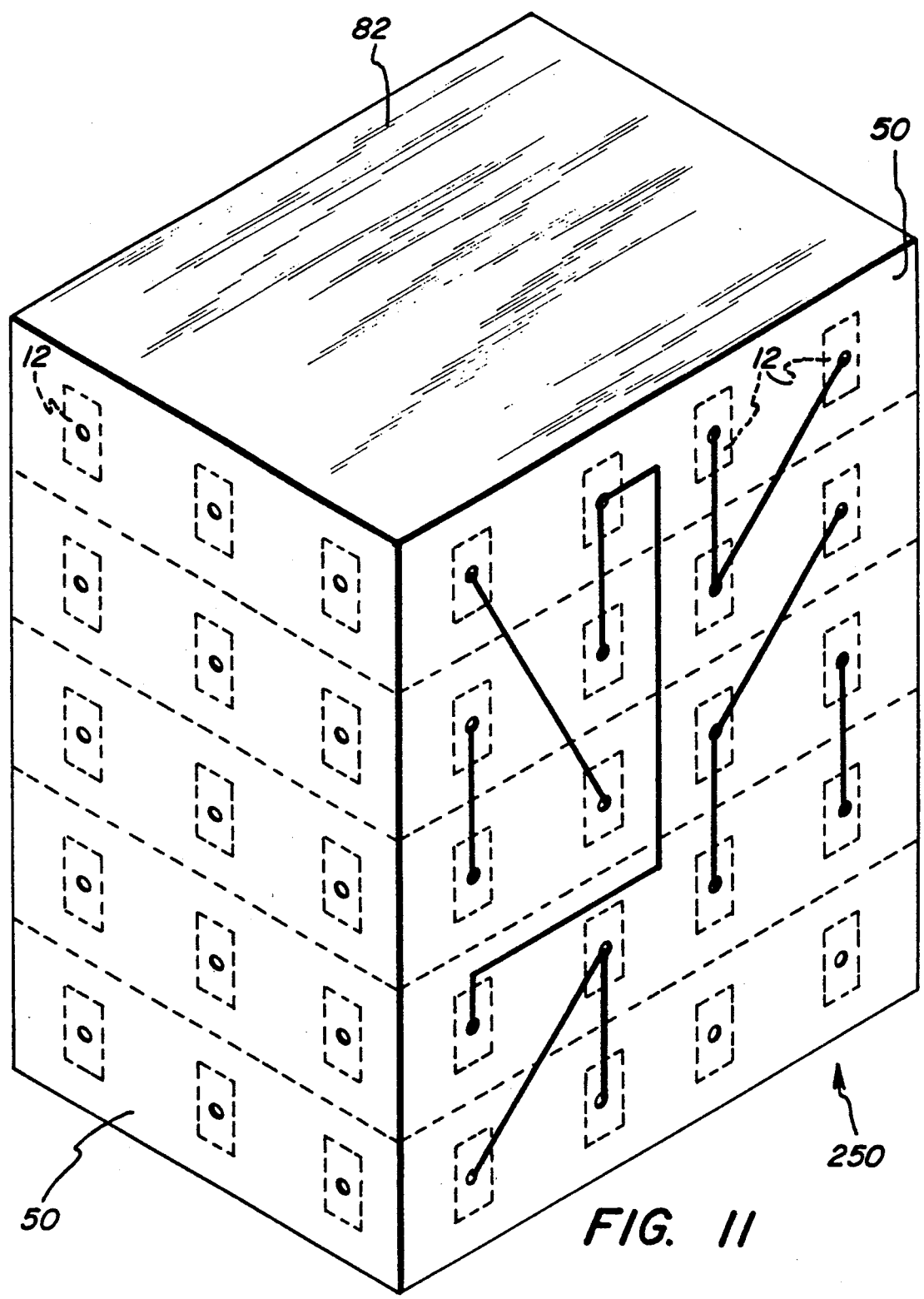
FIG. 11 is a perspective view of a stacked module where the substrates in the stack have been interconnected by an interconnect pattern present on an insulative layer on the sides of the stack.

FIG. 11 shows a stack 82 of interconnected HDI substrates 50, with interconnect lines 250 shown generally. The interconnect lines connect with the metal edge contact pads 12 on the sides of substrates 50 through the via holes which have been laser dithered. The left side of stack 82 is shown blank to emphasize that the HDI substrates can be selectively interconnected, using the adaptive lithography system, by any pattern applied on top of the insulative film on the sides of the stack. Multiple layers of interconnects can be applied to the sides of the stack by simply placing additional insulative layers on the sides, forming via holes, and patterning a metal on the applied layer. The processes described for forming the first layer of interconnect lines 250 is simply repeated as many times as necessary. The incorporation of power/signal planes can be achieved with the significant advantage that the lines are very short and matched in impedance both on the substrate and on the intersubstrate connections.

Figure 12:
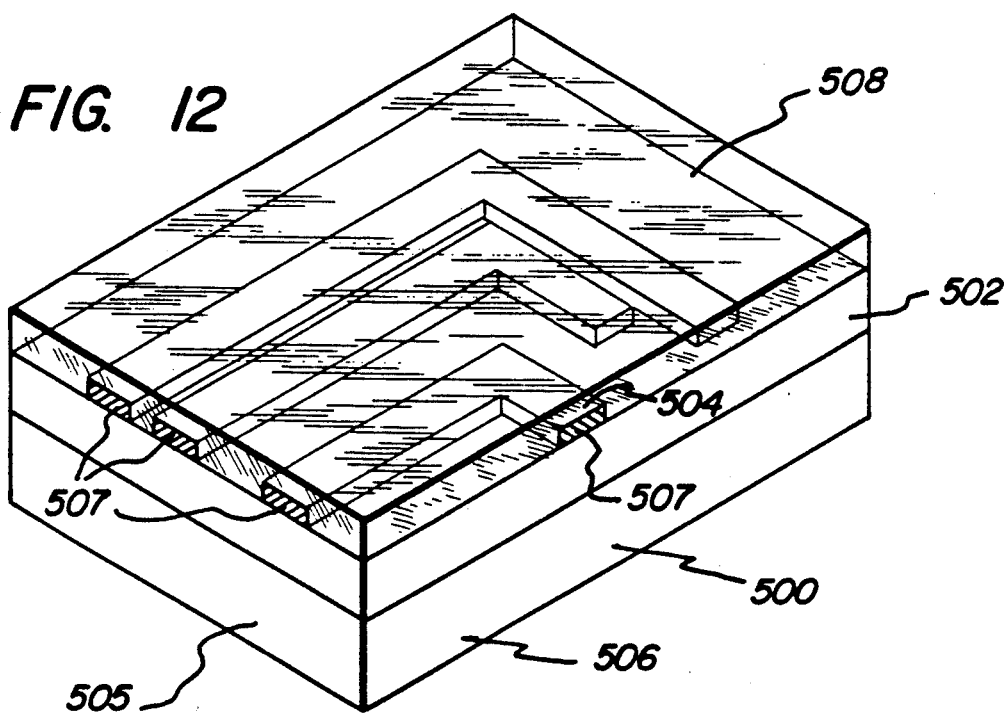
FIG. 12 is a perspective view of a substrate having metal edge connections where the cross section of the metal edge connection serves as an interconnect side.
Figure 13:
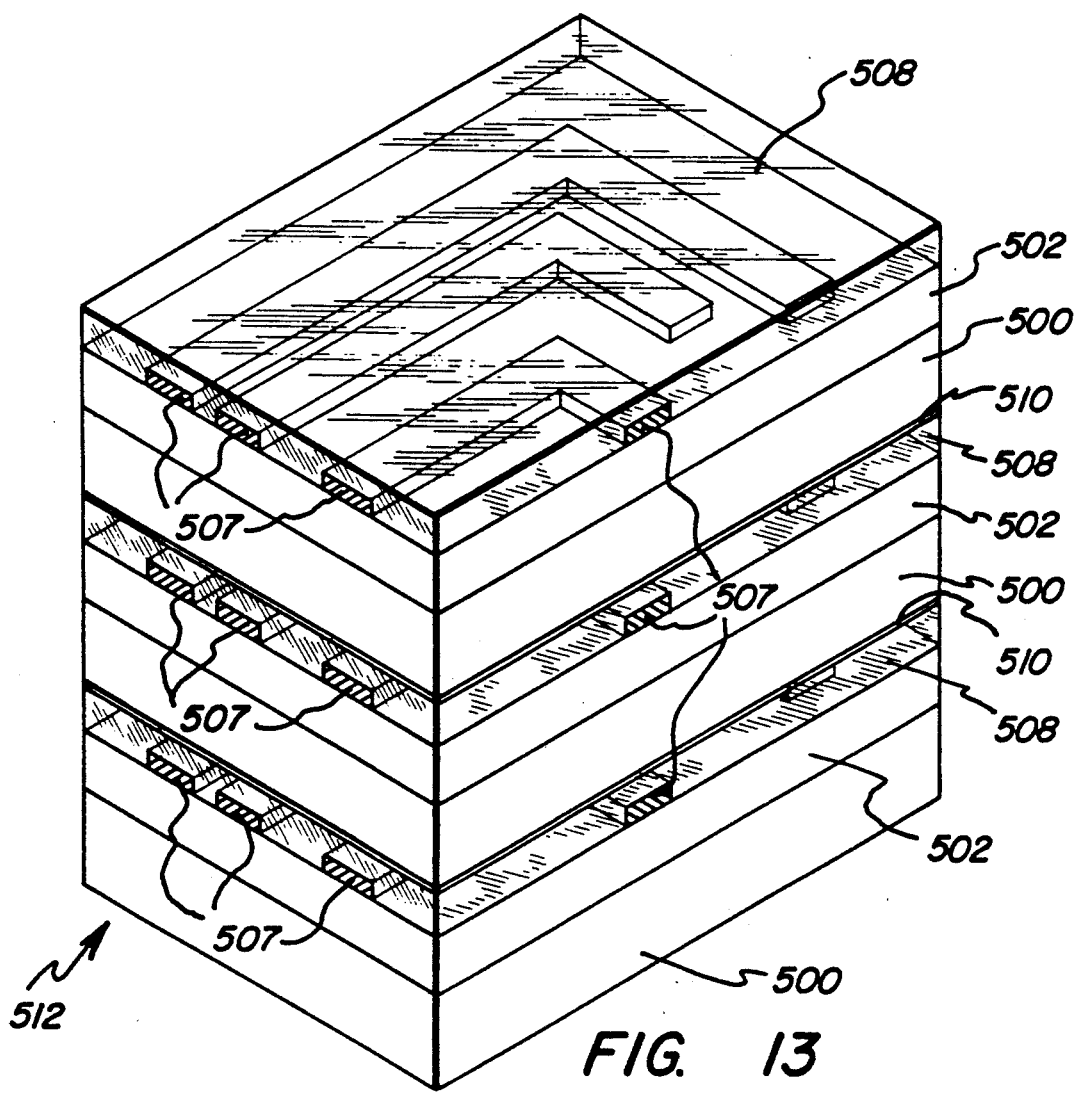
FIG. 13 is a perspective view of a stack of substrates, as shown in FIG. 12, where the cross sections of the metal edge connections are exposed on the side of the stack.

FIGS. 12 and 13 illustrate that wraparound metal edge connection pads 12, as shown in FIG. 4, are not absolutely necessary for producing an interconnected stacked module, such as module 82 shown in FIG. 11. In FIG. 12, a substrate 500 having integrated circuits (not shown) is positioned below a dielectric overlay layer 502. Metal conductors 504 extend through metal-filled vias formed in dielectric overlay layer 502 to connect to the integrated circuits, and the metal conductors extend to the edges 505 and 506 of the substrate. Each of the cross sections 507 of those of metal conductors 504 which are exposed at edges 505 and 506 provides a large enough site for later interconnection in a stacked array and, therefore, serves the same function as metal edge connection pads 12 shown in FIGS. 1 and 4. (Note that a thickness of one micron is required for a connection site when using the adaptive lithography system). A protective overcoat 508, such as Silicone Polyimide 2065 of M&T Chemicals, is applied over metal conductors 504 to promote stackability.

As shown in FIG. 13, several of the substrates created in accordance with FIG. 12 are held together by an adhesive 510 to form a stack 512. Stack 512 can be created with the aid of an alignment jig such as shown in FIG. 6 and discusse in relation thereto. The exposed metal conductor 504 cross sections 507 can be interconnected in the same fashion as described with regard to FIGS. 7 through 11.

An important feature of the structures shown in FIGS. 12 and 13 is that substrate 500 can be a substrate frame similar to substrate 10 shown in FIG. 1 or, alternatively, substrate 500 can be a single integrated circuit chip. If substrate 500 is comprised of a single integrated circuit chip, the only major difference in the stacked module of FIG. 12 would be that edge connection pads 12 would not be required. Fabrication of stack 512 would follow the same steps required in forming stack 82 as described with regard to FIGS. 5, 6 and 7.

Figure 14:
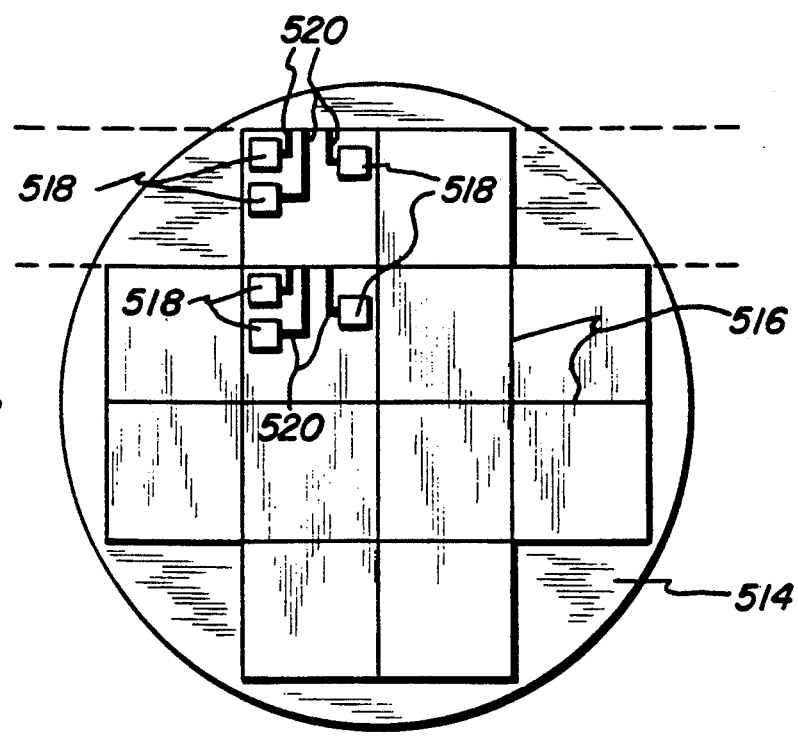
FIG. 14 is a plan view of a wafer which will be sawed into a plurality of integrated circuit chips where the saw lines cut through metallization extending from the chip pads.
Figure 15:
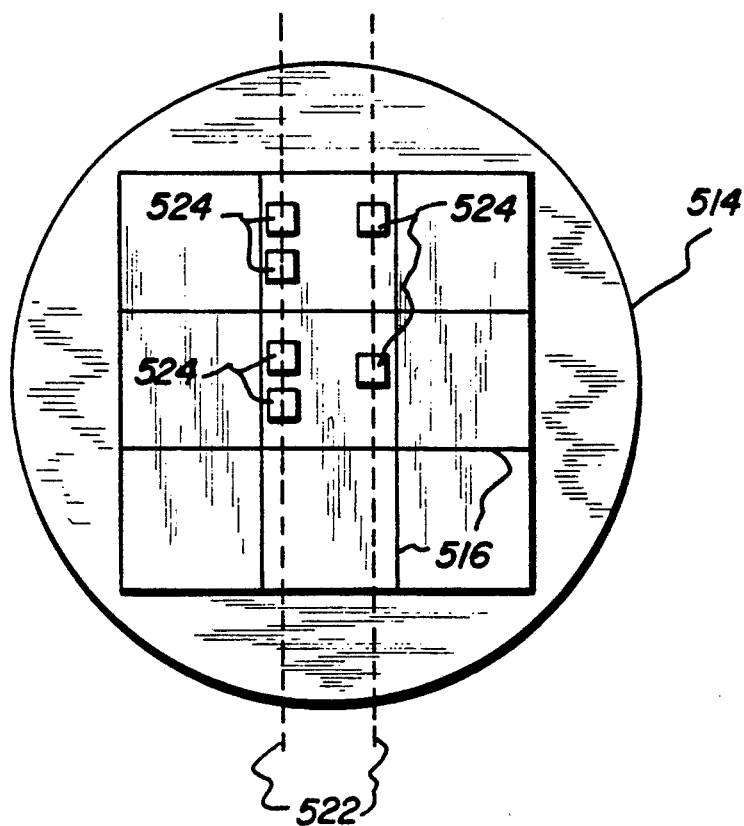
FIG. 15 is a plan view of a wafer which will be sawed into a plurality of integrated circuit chips where the saw lines cut through the chip pads.

FIGS. 14 and 15 illustrate alternative methods for fabricating a substrate 500 (as shown in FIG. 13) where the substrate is an integrated circuit chip. As shown in FIG. 14, a semiconductor wafer 514, which has been overcoated with an insulating layer, has a grid pattern 516 defining a plurality of chips. Vias are etched through the insulator to the chip pads 518. Aluminum or copper metallization is deposited on the wafer and patterned such that metal lines 520 extend to the edge of each prospective chip. The wafer 514 is then overcoated with a protective layer such as polyimide (not shown) which will allow the chips to be stacked without damage to metal lines 520. The wafer 514 is then sawed along lines on the grid pattern 516 to yield a chip substrate (such as substrate 500 shown in FIG. 13) having metal lines 520 that have a desired cross section of exposed metal on the chip edge. Several chip substrates 500 are stacked as shown in FIG. 13 and an interconnect pattern is formed on the sides of the stack 512 similar to the selective interconnect pattern 250 shown in FIG. 11.

In FIG. 15, saw lines 522 (noted as dashed lines) are shown bisecting existing metal chip pads 524 on wafer 514. This substrate fabrication method has the desirable feature that no additional processing to form lines connected to chip pads 524 on the wafer is necessary. A disadvantage of this method is that the interconnections of the chips must be made where the chip pads are located, which is generally all four sides of the chip. The chips are stacked and interconnected on their sides as described above. Connection to each chip pad 524 must be made within the thickness of the pad, which is typically one micron.

An important advantage of this invention is the repairability of an interconnected module 82 of stacked HDI substrates 50, as best shown in FIG. 11. To remove the interconnect pattern 250, the sides of stack 82 are heated so as to raise the sides to a temperature above the melting point of the adhesive on the edges 14 of substrates 50 (shown in FIG. 4) while leaving the adhesive on the substrate itself at a temperature below its melting point. In the case of Silicone Polyimide 2065 supplied by M&T Chemicals, the melting point temperature is 190° C. Insulative layer 80 which carries interconnect lines 250 is simply peeled off when the adhesive holding it on the sides of stack 82 melts. Residual material, such as metal "divots" at each contact pad 12 (shown in FIG. 4) and edge adhesive (Silicone Polyimide 2065), is removed by dipping stack 82 in successive solvent baths. For removing the edge adhesive, the progression of solvents may include: first, a good solvent for the adhesive; second, a cleaner version of the good solvent; third, the cleanest version of the good solvent; fourth, a "less good" clean solvent; and fifth, a rinse in a volatile but poor solvent. The purpose of the progression is to get the residual edge adhesive dissolved off, then to remove the solvent which contains some residual material before it evaporates and leaves any residue. Solvents which have been used are: methylene chloride for the good solvent, acetone as the intermediate solvent, and Freon® fluorinated hydrocarbon solvent, available from E. I. duPont de Nemours and Company as the poor solvent. The "metal divots" may then be removed by a four-minute soak in concentrated nitric acid which attacks copper but not the aluminum metal edge contact pad 12 (shown in FIG. 4). Ultrasonic agitation can assist in breaking off the metal divots. The metal divots thus fall off, leaving behind the metal edge contact pads. The sides of stack 82 are then rinsed with deionized water and sprayed with high pressure water, thereby cleaning the stack to the point where another insulative layer can be applied to the sides of the stack.

In order to replace one of the HDI substrates 50 (as shown in FIG. 4) in a stack 82 (as shown in FIG. 11) which has been cleaned as described above, the stack is heated to the melting point of the adhesive which holds the stack together. Upon reaching the melting point temperature, the substrate to be removed may be gently pried away using a knife blade. A "good" HDI substrate 50 is then inserted into the stack and adhesively bonded with an alignment jig such as jig 60 shown in FIG. 5. Alternatively, if stack 82 is held together by fasteners such as nut and bolt combinations 62, as shown in FIG. 6, the bolts are simply removed from the apertures in the corners of the substrates 50 and the defective substrate is simply replaced. The replacement substrate is preferably coated with thermal grease to insure restoration of good heat conductivity through the stack.

The interconnection of a repaired stack proceeds exactly the same as when creating an interconnected stacked module 82, such as shown in FIG. 11. The ability to simply remove the interconnection pattern 250 from the sides of a stacked module 82 provides the additional feature of being able to redesign the interconnection scheme. The procedure for repairing the stack of substrates illustrated in FIG. 13 is the same as described above.

Figure 16:
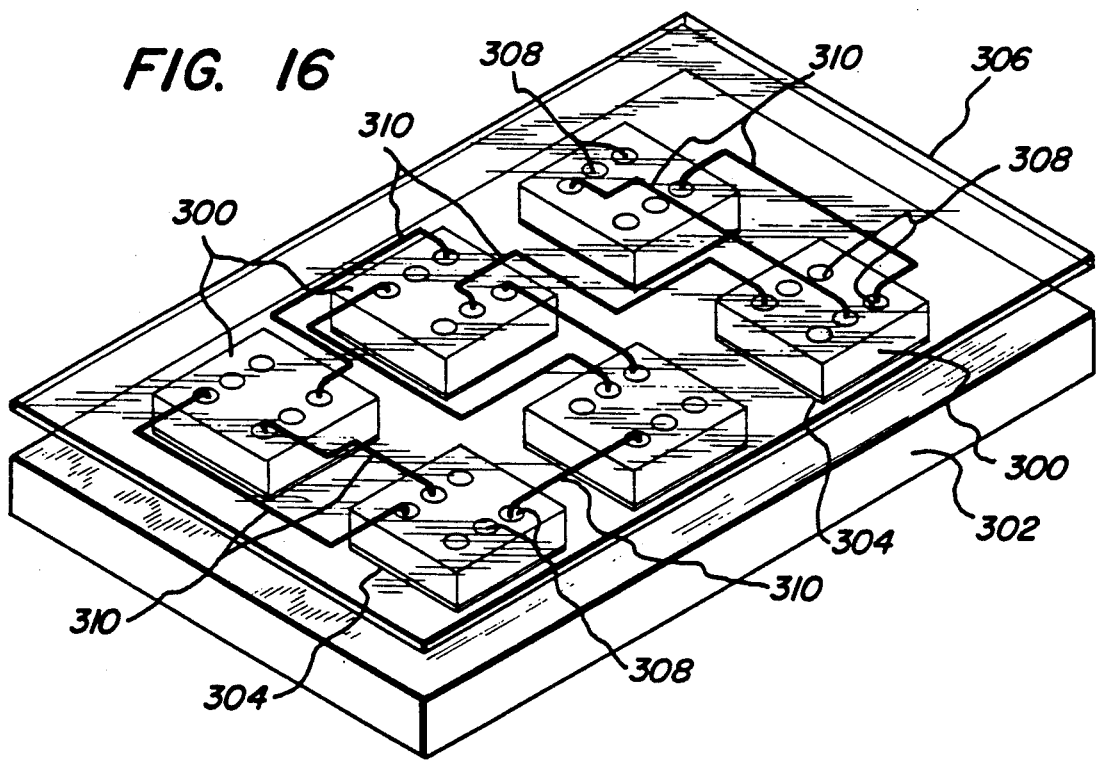
FIG. 16 is a two-dimensional array of stacked modules which are interconnected by a metal pattern on a polymer overlay layer and the modules are bonded on a carrier.
Figure 17:
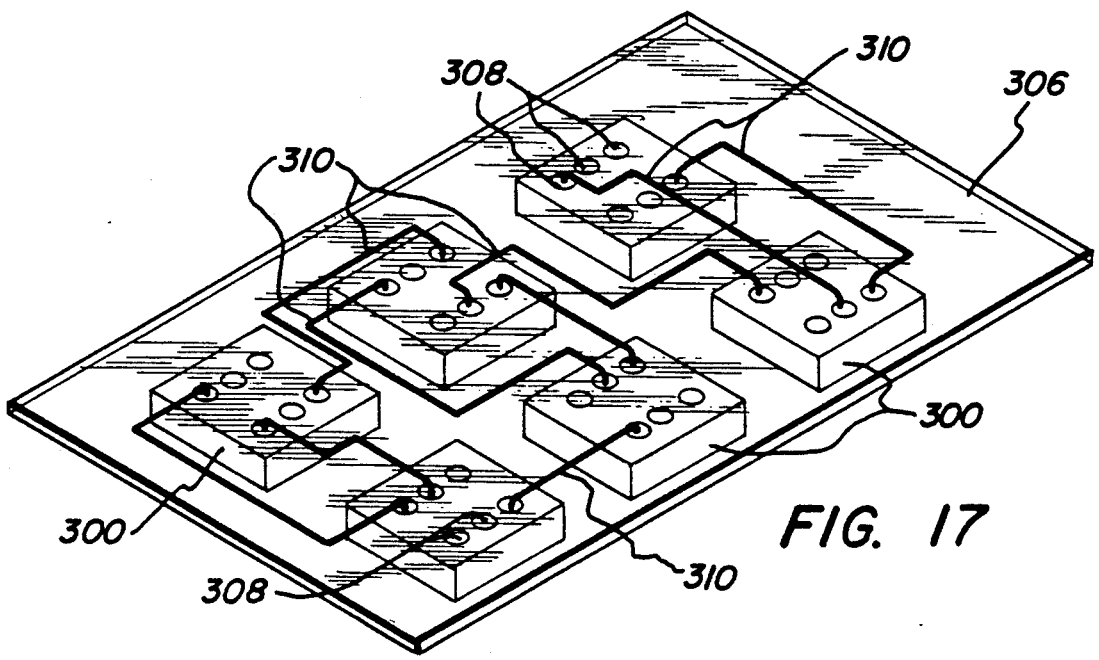
FIG. 17 is a two-dimensional array of stacked modules which are interconnected by a metal pattern on a polymer overlay layer and no carrier is required.

FIGS. 16 and 17 show another embodiment of the invention and illustrate alternative configurations of two-dimensional arrays of substrates 300. The substrates 300 may be comprised of the stacked module 82 shown in FIG. 11, the HDI substrate shown in FIG. 4, leadless chip carriers, or the substrate 500 shown in FIG. 12 (note that substrate 500 may be a single integrated circuit chip). As shown in FIG. 16, a plurality of substrates 300 are bonded on a carrier 302 by an adhesive 304 that allows for easy removal and repair. Carrier 302 may comprise a heat sink or a large alumina substrate. Substrates 300 are arranged as shown and sprayed with an adhesive. The an insulative film 306, such as a Kapton sheet that has been processed as described above, is laminated over the modules using a pressure/vacuum laminator such as that shown in FIG. 7. Via holes are laser dithered through the insulative film down to metal contact pads 308. A metal pattern 310 is then formed on top of insulative film 306 using the aforementioned adaptive lithography system. Repair is accomplished by removal of the insulative film 306 and replacement of a defective substrate 300 followed by applying a new insulative film 306 over the two-dimensional array of substrates 300 and creating a new metal interconnection pattern 310. The advantage of this structure is that the interconnect pattern 310 can have a much finer pitch than available on a printed circuit board and, therefore, a greater number of integrated circuits can be interconnected. In addition, the overlaying insulative film 306 is flexible and, therefore, it produces less stress than if the substrates 300 were mounted to leads on a printed circuit board.

FIG. 17 illustrates a two-dimensional array of substrates 300 interconnected by a metal pattern 310 formed on a polymer overlay layer 306 as described in conjunction with FIG. 12; however, no carrier is present. When the processing described above in conjunction with FIG. 16 is completed, substrates 300 are removed from the carrier 302. Removal can be accomplished by any of several methods. First, a minimum amount of die attach material can be used to hold the substrates 300 to carrier 302 of FIG. 16, and this material can simply be heated to a point where the substrates 300 can be poked off the carrier with a knife blade. Second, Udel polysulfone resin available from Union Carbide Corporation of Danbury, Conn. can be used as the adhesive to connect substrates 300 to the carrier. The Udel resin can then be dissolved by cyclohexanone with no damage to substrates 300. Third, a molybdenum sheet can be used as the carrier and this sheet can be dissolved with nitric acid after fabrication of the metal pattern 310. The advantage of the circuit of FIG. 17 is that the volume required by the circuit is not much greater than the volume of silicon making up the circuit, i.e., it has a volumetric efficiency approaching 100%. While FIG. 17 illustrates the stacked substrates as being spaced relatively far apart, it will be understood that to achieve the 100% volumetric efficiency, adjacent substrates 300 will be touching one another or be extremely close to one another. Of particular importance to this invention is the fact that many rows of integrated circuit chips or stacked modules or HDI substrates can be held together by layer 306 (Kapton film) and electrically connected by pattern 310, and this film can be rolled up so as to enable it to be cooled by a liquid coolant, such as Freon or liquid nitrogen running through the roll, when the circuit is operating.

Figure 18:
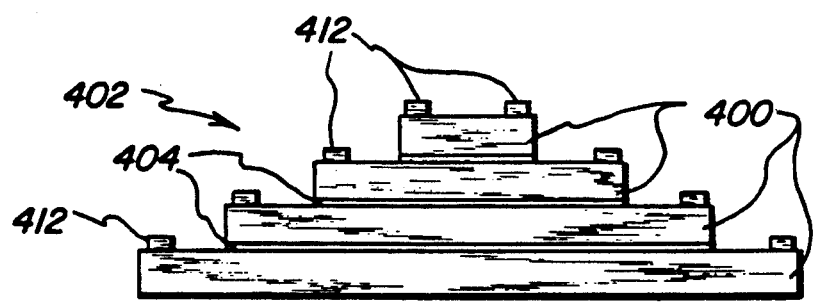
FIG. 18 is a side elevational view of a plurality of HDI substrates that are bonded to form a pyramid stack.

FIG. 18 shows yet another embodiment of the invention where HDI substrates 400 of different dimensions are stacked in the form of a pyramid structure 402. The HDI substrates 400 are fabricated according to the above-described techniques and in accordance with the teachings of the above-referenced co-pending patent applications. The HDI substrates 400 are bonded together with an adhesive 404 which is preferably the aforementioned Silicone Polyimide 2065. The bonding operation can be performed in an appropriate jig which exerts a pressure of up to twenty pounds per square inch. The metal edge contact pads 412 on each HDI substrate 400 are not required to extend around the edge of the substrate because they are exposed from above in the pyramid stack 402 configuration.

Figure 19:
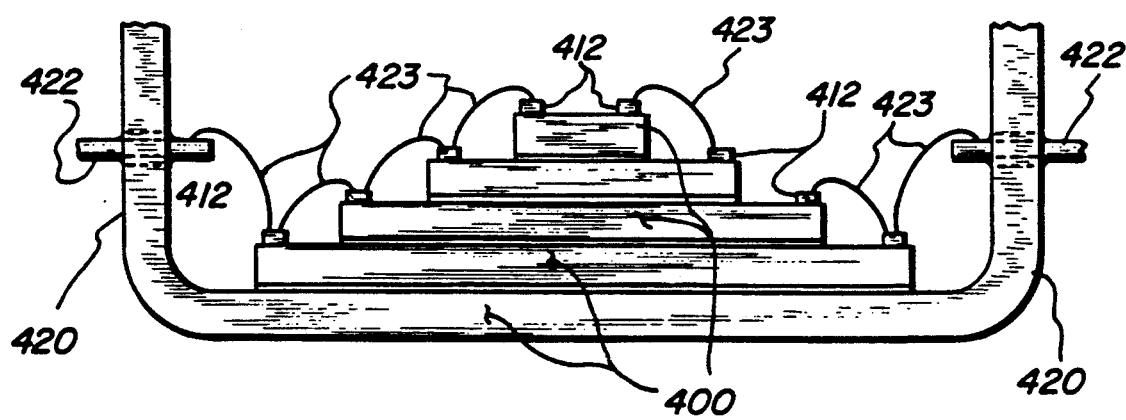
FIG. 19 is a cross-sectional side view of a pyramid stack of HDI substrates in an alloyed metal can with wires extending through the side of the can.

FIG. 19 illustrates the pyramid stack 402 of FIG. 18 housed in a can 420 which may be comprised of Kovar ® alloyed available from Carpenter Technology Corporation, Reading, Pa. Metal conductors or wires 422 are connected to the metal edge contact pads 412 by conventional wire bonding techniques. Wire bonds 423 are used to interconnect all of the substrates with the metal wires. The metal wires 422 protrude through the side of can 420. Repair of the pyramid stack 402 is accomplished by removing the wire bonds 423 between the metal wires 422 and the pads 412. Then the pyramid stack 402 is removed from the can. The defective (bad) HDI substrate 400 is replaced in accordance with procedures described above, and the pyramid stack 402 is reassembled and reinserted into can 420.

While the invention has been described in terms of the preferred embodiment of the invention which includes specific arrangements of HDI substrates, those skilled in the art will recognize that alternative arrangements may be substituted within the spirit and scope of the appended claims.

What we claim is:

1. A stack of interconnected integrated circuits, comprising:
   a plurality of substrates in a stacked configuration, each of said substrates having an integrated circuit positioned thereof, respectively;
   electrical connecting means on each of said substrates, respectively, for providing electrical connection sites on a side of said stacked configuration of said plurality of substrates, said electrical connection means on each of said substrates, respectively, being electrically connected to said integrated circuit positioned on each of said substrates, respectively;
   holding means for holding said substrates together in said stacked configuration; and
   interconnecting means comprising an insulative film laminated to said side of said stacked configuration of said plurality of substrates, and conductor means positioned on said insulative film and passing through via holes in said film to selected ones of said electrical connection sites for selectively interconnecting said selected ones of said sites.

2. A stack of interconnected integrated circuits as recited in claim 1 wherein said electrical connection means on each substrate of said plurality of substrates comprises metal pads on a surface of said substrate, said metal pads being electrically connected to said integrated circuit on said substrate, said metal pads being positioned on an edge of said substrate aligned with said side of said stacked configuration.

3. A stack of interconnected integrated circuits as recited in claim 1 wherein said electrical connection means on each substrate of said plurality of substrates comprises metal conductor lines electrically connected to metal pads positioned on a surface of said substrate, said metal pads being electrically connected to said integrated circuit on said substrate, said metal conductor lines extending to said edge of said substrate.

4. A stack of interconnected integrated circuits as recited in claim 3 wherein said metal conductor lines are situated on an insulative layer on said surface of said substrate, said stack further including metal-filled vias providing electrical pathways between said metal conductor lines of one substrate in said stack and said metal pads on another substrate in said stack.

5. A stack of interconnected integrated circuits as recited in claim 1 wherein said electrical connection means on each substrate of said plurality of substrates comprises: first metal conductor lines on said substrate extending from points on said substrate to an edge of said substrate, a polymer overlay layer extending over said substrate surface, second metal conductor lines situated on a surface of said polymer overlay layer, first metal-filled vias in said polymer overlay layer electrically connecting said first and second metal conductor lines, metal pads positioned under said polymer overlay layer, and second metal-filled vias in said polymer overlay layer electrically connecting said second conductor lines to said metal pads, said metal pads being electrically connected to said integrated circuit on said substrate.

6. A stack of interconnected integrated circuits as recited in claim 5 wherein said metal pads are wrapped around said edge of said substrate.

7. A stack of interconnected integrated circuits as recited in claim 1 wherein said holding means comprises mechanical fastening means extending through each of said substrates.

8. A stack of interconnected integrated circuits as recited in claim 7 wherein said mechanical fastening means comprises bolts extending through each of said substrates and being fastened to said stack by corresponding nuts.

9. A stack of interconnected integrated circuits as recited in claim 1 wherein said holding means comprises adhesive layers positioned between, and bonding together, each adjacent pair of substrates in said stacked configuration so as to unite said stacked configuration into a bonded unit.

10. A stack of interconnected integrated circuits as recited in claim 1 wherein said insulative film comprises a removable dielectric layer, and said conductor means comprises a metal interconnect pattern situated on said dielectric layer, said electrical connection sites being electrically connected to said interconnect pattern by metal-filled vias in said dielectric layer.

11. A stack of interconnected integrated circuits as recited in claim 10 wherein said dielectric layer comprises a thermoplastic film.

12. A stack of interconnected integrated circuits as recited in claim 1 wherein said substrates and said integrated circuits have matched thermal coefficients of expansion.

13. An array of interconnected integrated circuits suitable for conductive cooling by liquid coolant, comprising:
   a plurality of modules situated in a two-dimensional array, each of said modules having an integrated circuit respectively positioned thereon and an electrical connection site respectively situated on a surface thereof, said surface of each respective module in said array facing in a common direction, each of said modules further including electrical connection means respectively situated thereon for electrically connecting said integrated circuit respectively situated thereon with said electrical connection site respectively situated on said surface thereof;

a polymer overlay layer extending over, and bonded to, said plurality of modules in said array and extending over, and bonded to, each of said surfaces, said polymer overlay layer having openings therein exposing said electrical connection sites; and a metal interconnect pattern on said polymer overlay layer for selectively interconnecting said electrical connection sites, said interconnect pattern having metal portions extending through said openings in said polymer overlay layer so as to make electrical connection to said electrical connection sites.

14. An array of interconnected integrated circuits as recited in claim 13 and further including a removable thermoplastic adhesive bonding said polymer overlay layer to said modules.

15. An array of interconnected integrated circuits as recited in claim 13 wherein each of said modules comprises a plurality of substrates arranged in a stack, each of said substrates having electrical components respectively positioned thereon and including second electrical connection means respectively situated thereon, a second electrical connection site respectively positioned at an edge of each respective one of said substrates, said second electrical connection means on each respective one of said substrates electrically connecting said electrical components respectively positioned thereon with said second electrical connection site on each respective one of said substrates, a second polymer overlay layer positioned on a side of said stack so as to cover each of said edges carrying the second electrical sites, a second metal interconnect pattern formed on said second polymer overlay layer, and metal-filled vias in said second polymer overlay layer electrically connecting said second metal interconnect pattern with said second electrical connection sites.

16. An array of interconnected integrated circuits as recited in claim 13 further comprising a carrier bonded in common to said modules.

17. A stack of interconnected integrated circuits, comprising:

a plurality of substrates, each of said substrates having an integrated circuit positioned thereon, respectively, the circuitry of each of said integrated circuits being accessible on the upper surface thereof;

each of said substrates being of dimensions different from one another and being arranged in a stack where the largest substrate is at the base and progressively smaller substrates are stacked thereon;

first electrical connecting means on each of said substrates, respectively, for providing electrical connection sites on an edge of each of said substrates, respectively, and being connected to said integrated circuit positioned thereon, respectively, said electrical connection sites being exposed in said stack;

holding means for holding said stack together; and second electrical connecting means electrically connected and metallurgically bonded to said electrical connection sites.

18. A stack of interconnected integrated circuits as recited in claim 17 wherein said holding means comprises a thermoplastic adhesive positioned between, and bonding together, each adjacent pair of said substrates in said stack so as to unite said stack into a bonded unit.

19. A stack of interconnected integrated circuits as recited in claim 17 wherein said second electrical connecting means comprises a plurality of wires, said wires being electrically bonded to predetermined ones of said electrical connection sites on predetermined ones of said substrates in said stack.

20. A stack of interconnected integrated circuits as recited in claim 17 wherein said first electrical connecting means on each of said substrates, respectively, comprises metal lines extending between said electrical connection sites on said each of said substrates and said integrated circuit positioned on said each of said substrates.

21. A stack of interconnected integrated circuits as recited in claim 17 further comprising a walled housing, wire conductors extending through a wall of said housing, and third electrical connecting means, said stack of substrates being adhesively bonded to the inside of said housing, said third electrical connecting means electrically connecting said wire conductors with said electrical connection sites.

22. A stack of interconnected integrated circuits as recited in claim 17 wherein said stack is of pyramidal configuration.

* * * * *